United States Patent [19]
Kirby

[11] 4,088,950
[45] May 9, 1978

[54] IMMITTANCE MONITORING APPARATUS

[75] Inventor: Thomas J. Kirby, Pelham, N.H.

[73] Assignee: GTE Sylvania Incorporated, Stamford, Conn.

[21] Appl. No.: 763,857

[22] Filed: Jan. 31, 1977

[51] Int. Cl.² .......................... G01R 21/06; H04B 1/04
[52] U.S. Cl. .................................. 324/95; 324/83 R; 324/142; 328/155
[58] Field of Search .................... 324/142, 95, 585 B, 324/141, 83 R, 83 D; 328/155, 55

[56] References Cited

U.S. PATENT DOCUMENTS

| | | | |
|---|---|---|---|
| 2,205,228 | 6/1940 | Smith | 324/142 |
| 2,416,977 | 3/1947 | Brown et al. | 324/142 |
| 3,789,301 | 1/1974 | Malaviya | 324/58.5 B |

OTHER PUBLICATIONS

Catalog U; General Radio Co., West Concord, Mass.; Feb. 1970, p. 157.

Primary Examiner—Rudolph V. Rolinec
Assistant Examiner—Ernest F. Karlsen
Attorney, Agent, or Firm—David M. Keay

[57] ABSTRACT

Apparatus for monitoring the voltage, current, and phase of an RF signal in a transmission line. A current measuring section having a low input impedance is coupled to the transmission line and employs an isolation amplifier stage of two bipolar transistors in push-pull to produce an output signal representing the current in the RF signal. A voltage measuring section having a high input impedance is coupled to the transmission line and employs an isolation amplifier stage of two field effect transistors in a series cascade arrangement to produce an output signal representing the voltage of the RF signal. The sections include coaxial delay lines of different lengths to compensate for different internal propagation delays so that the phase relationship between the output signals representing voltage and current is the same as in the RF signal being monitored.

5 Claims, 2 Drawing Figures

IMMITTANCE MONITORING APPARATUS

BACKGROUND OF THE INVENTION

This invention relates to apparatus for measuring parameters of an RF signal. More particularly, it is concerned with apparatus for providing an instantaneous representation of the voltage, current, and phase of an RF signal.

Typically the values of the electrical parameters of voltage, current, and phase of an RF signal are determined by indirect measurements. In one technique directional couplers are inserted into the transmission line carrying the RF signal to measure the forward and reflected voltages present in the transmission line. The values of the electrical parameters are then determined by mathematical computations employing the measured data. In addition, when directional couplers are inserted in the transmission line and the coupling to the monitored RF signal is increased in order to increase measurement sensitivity, a significant disturbance is introduced into the system. Thus, the monitored RF signal is perturbed and the accuracy of the measurements is affected.

SUMMARY OF THE INVENTION

Immittance monitoring apparatus in accordance with the present invention provides the complete electrical information necessary for representing voltage, current, and phase contents of a signal being monitored. The results are obtained instantaneously and without significantly affecting the monitored signal. The apparatus includes transmission line means along which the signal being monitored is conducted. A current signal amplifier means produces a current output signal at a current signal output terminal which represents the current flow of the signal in the transmission line means. The current signal amplifier means includes a current signal isolation amplifier stage and a current signal input coupling means which is coupled to the transmission line means and to the input of the current signal isolation amplifier stage. The current signal input coupling means provides a low input impedance path to the current signal isolation amplifier stage, and the current signal isolation amplifier stage provides impedance transformation between the signal present at its input and the signal produced at its output. A current signal delay means couples the signal at the output of the current signal isolation amplifier stage to the current signal output terminal and produces a first predetermined time delay between the signal at the output of the current signal isolation amplifier stage and the current output signal at the current signal output terminal.

The apparatus also includes a voltage signal amplifier means which produces a voltage output signal representing the voltage of the signal in the transmission line means at a voltage signal output terminal. The voltage signal amplifier means includes a voltage signal isolation amplifier stage and a voltage signal input coupling means which is coupled to the transmission line means and to the input of the voltage signal isolation amplifier stage. The voltage signal input coupling means provides a high input impedance path to the voltage signal isolation amplifier stage, and the voltage signal isolation amplifier stage provides impedance transformation between the signal present at its input and the signal produced at its output. A voltage signal delay means couples the signal at the output of the voltage signal isolation amplifier stage to the voltage signal output terminal and produces a second predetermined time delay between the signal at the output of the voltage signal isolation amplifier stage and the voltage output signal at the voltage signal output terminal.

The first predetermined time delay of the current signal delay means plus propagation delays in the current signal input coupling means and in the current signal isolation amplifier stage are equal to the second predetermined time delay of the voltage signal delay means plus propagation delays in the voltage signal input coupling means and in the voltage signal isolation amplifier stage. Thus, the current output signal at the current signal output terminal representing current flow in said transmission line means is in proper phase relationship with the voltage output signal at the voltage signal output terminal representing voltage in the transmission line means. The output signals at the current signal output terminal and at the voltage signal output terminal contain all the necessary information representing the voltage, current, and phase of the signal in the transmission line means.

BRIEF DESCRIPTION OF THE DRAWINGS

Additional objects, features, and advantages of voltage, current, and phase monitoring apparatus in accordance with the present invention will be apparent from the following detailed discussion together with the accompanying drawings wherein.

DETAILED DESCRIPTION OF THE INVENTION

Figure 1:
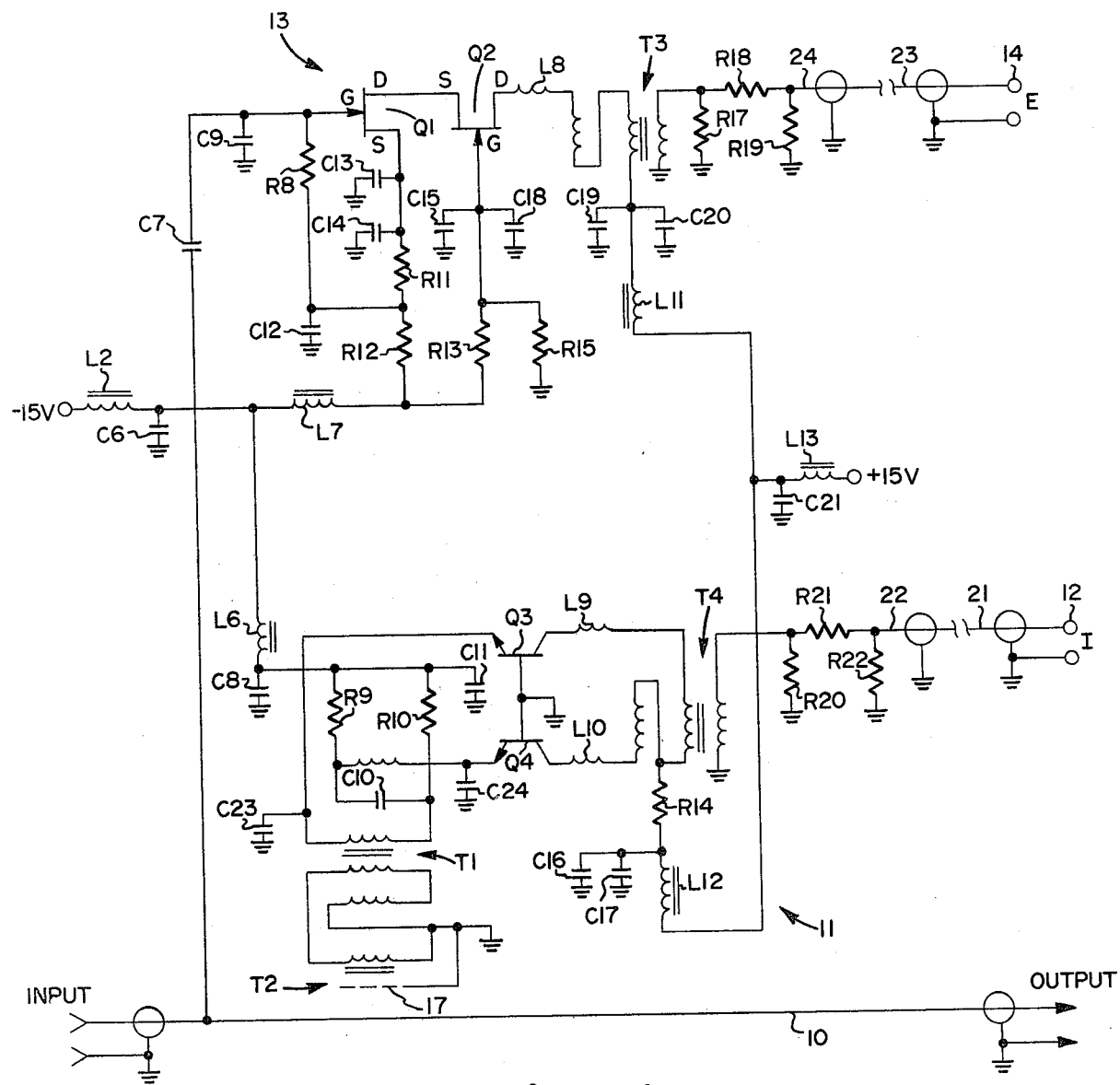
FIG. 1 is a schematic circuit diagram of voltage, current, and phase monitoring apparatus in accordance with the present invention for monitoring an RF signal of relatively high power level.

FIG. 1 illustrates immittance monitoring apparatus in accordance with the present invention for monitoring an RF signal of relatively high power level. The signal is transmitted along a suitable transmission line 10 between input and output terminals. The apparatus includes a current measuring section 11 for producing an output signal I at an output terminal 12 representing the current flow of the RF signal in the transmission line 10. The apparatus also includes a voltage measuring section 13 for producing an output signal E at an output terminal 14 representing the voltage of the RF signal in the transmission line 10.

The current measuring section 11 includes an arrangement of input transformers T2 and T1. In the particular embodiment under discussion the transmission line 10 is 50 ohm strip transmission line. The transmission line 10 forms a single primary turn of the transformer T2 which is a step-down transformer. The secondary of the transformer T2 is shielded from capacitive coupling to the voltage present in the transmission line by a faraday shield 17. The output secondary of transformer T2 is balanced and the transformer is center-tapped to ground such that any residual capacitive coupling to the voltage on the transmission line is cancelled as a common mode signal at the balanced transformer output load.

The output of transformer T2 is coupled through another current step-down transformer T1 to the emitters of a push-pull current isolation amplifier stage employing two NPN bipolar transistors Q3 and Q4. A DC blocking capacitor C10 interconnects the two halves of the transformer T1 secondary. The bases of transistors Q3 and Q4 are connected directly to the ground and transistor input current is biased through emitter resistors R9 and R10 which are connected to a −15 volt supply. Components L2, C6, L6, C8, and C11 are RF filtering elements for the −15 volt supply.

Transformer T4 is a balanced output transformer which couples the 200 ohm collector impedance of the transistors Q3 and Q4 to a 50 ohm single-ended output. Resistors R20, R21, and R22 provide a 16db 50 ohm output pad connected between the transformer T4 and an output connection 22. Components L13, C21, L12, C16, C17, and R14 are RF filtering elements for a +15 volt supply. Components C23, C24, L9, and L10 are RF UHF parasitic isolation suppression elements.

In order to provide compensation for differences in propagation delays between the current measuring section 11 and the voltage measuring section 13 a length of 50 ohm coaxial cable 21 is connected between the output connection 22 and the current signal output terminal 12. In the particular embodiment under discussion the length of the coaxial delay line 21 is 18 inches.

The voltage measuring section 13 includes a direct connection to the transmission line 10 by way of a capacitive bridge formed by capacitors C7 and C9. Capacitor C7 may be a built-in capacitor in which a portion of the transmission line is one of the plates of the capacitor. The gate of a field effect transistor Q1 is connected between the capacitors C7 and C9. Field effect transistors Q1 and Q2 are connected in series in a cascode arrangement. The isolation amplifier stage including the transistors Q1 and Q2 together with the high input impedance arrangement provides negligible loading to the RF signal in the transmission line 10. Components L7, C12, C13, C14, C15, C18, R8, R11, R12, R13, and R15 provide proper biasing for transistors Q1 and Q2 and filtering for the −15 volt supply.

Transformer T3 is a single-ended output transformer for transforming the 200 ohm output impedance of the transistors to a 50 ohm output impedance. Resistors R17, R18, and R19 provide a 16db 50 ohm output pad connected between the transformer T3 and an output connection 24. Inductance L8 is a parasitic frequency suppression element for stabilizing the isolation amplifier stage, and components C19, C20, and L11 are filtering elements for the +15 volt supply.

In order to match the propagation delays in the voltage measuring section 13 with those in the current measuring section 11 a length of 50 ohm coaxial cable 23 is connected between the output connection 24 and the voltage signal output terminal 14. In the particular embodiment under discussion the length of the coaxial delay line 23 is 5 inches.

The current measuring section 11 and the voltage measuring section 13 produces signals I and E at their output terminals 12 and 14 representing the current and voltage, respectively, of the RF signal in the transmission line 10. The low input impedance of the current measuring section 11 and the high input impedance of the voltage measuring section 13 introduce no significant perturbations into the RF signal. The amplifier stages including transistors Q3 and Q4 and transistors Q1 and Q2 provide impedance transformation and isolation between the signals present at their inputs and those produced at their outputs. By virtue of the compensated delays provided by the coaxial delay lines 21 and 23 the instantaneous measurements of current (I) and voltage (E) are in proper phase thereby providing all the information necessary for determining the power level of the RF signal.

Figure 2:
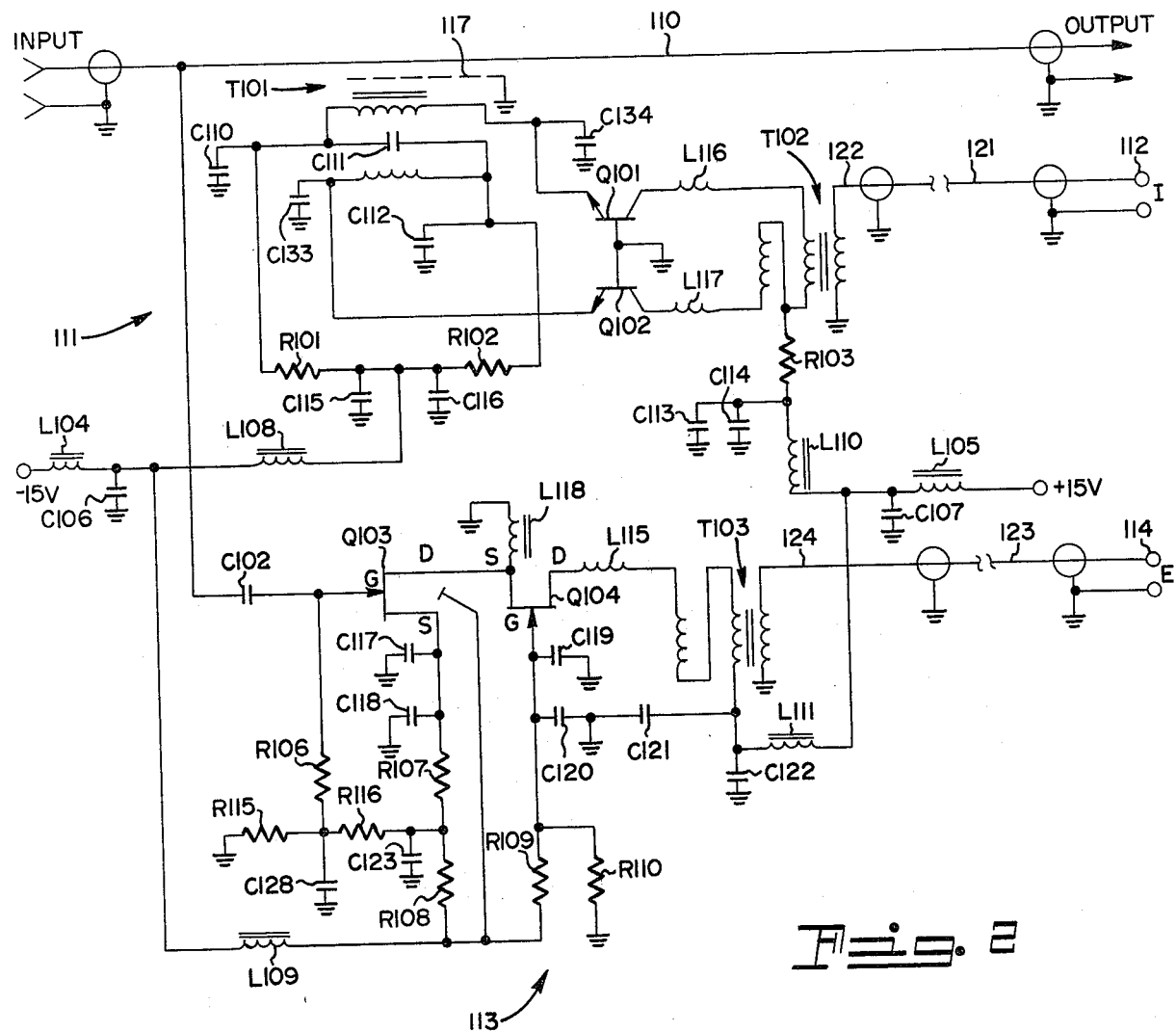
FIG. 2 is a schematic circuit diagram of voltage, current, and phase monitoring apparatus in accordance with the present invention for monitoring an RF signal of relatively low power level.

FIG. 2 illustrates an immittance monitoring apparatus in accordance with the present invention for determining the voltage, current, and phase of RF signals at a relatively low power level. The RF signal to be monitored is transmitted between input and output terminals on a transmission line 110, specifically of 50 ohm strip transmission line. The apparatus includes a current measuring section 111 which produces a signal I indicative of the current in the RF signal at an output terminal 112, and a voltage measuring section 113 which produces a signal E indicative of the voltage of the RF signal in the transmission line 110 at an output terminal 114.

The current measuring section 111 includes an input transformer T101 which has a two turn primary inserted in the transmission line 110. The two half windings of the secondary of transformer T101 are interconnected by a DC blocking capacitor C111. The transformer is connected across the emitters of transistors Q101 and Q102 which are NPN bipolar transistors arranged in a push-pull configuration. Voltage capacitive coupling is eliminated by the inclusion of a faraday shield 117 in the transformer T101 and also by the balanced construction of the circuitry. The isolation amplifier stage and the low input impedance network ensure the insertion of negligible series resistance in the transmission line current path.

An output transformer T102 transforms the 200 ohm balanced collector load of the transistors Q101 and Q102 of the isolation amplifier stage to a 50 ohm unbalanced output at an output connection 122. The delay line of 50 ohm coaxial cable 121 is connected between the connection 122 and the current signal output terminal 112. In the specific embodiment under discussion the length of the cable 121 is 19 inches.

The voltage measuring section 113 employs a capacitive bridge input including capacitor 102 and the total input capacity associated with the gate of a field effect transistor Q103, resulting in a division ratio of 2-to-1 for the input coupling. Field effect transistors Q103 and Q104 provide a cascade isolation amplifier stage which with the high input impedance network minimize perturbations of the RF signal being measured.

A single-ended output transformer T103 connected to the drain of transistor Q104 transforms the 200 ohm output of the transistors to the 50 ohm impedance at an output connection 124. A coaxial cable delay line 123 is connected between the connection 124 and the voltage output terminal 114. In the specific embodiment under discussion the cable 123 is 5 inches long. As explained previously the differential between delay lines 121 and 123 is such that the delays in sections 111 and 113 are equal so that the phase relationship between the I signal at the output terminal 112 and the E signal at the output terminal 114 is the same as in the RF signal in the transmission line 110.

Specific embodiments of the immittance monitoring apparatus illustrated in FIGS. 1 and 2 were fabricated employing the following components.

Apparatus of FIG. 1:

| Q1 | CP643 N-channel FET | C8 | .01 μf |
| Q2 | CP643 N-channel FET | C9 | 360 pf |
| Q3 | 2N5109 NPN bipolar | C10 | .1 μf |

-continued

|     | transistor |      |         |
| --- | --- | --- | --- |
|     |            | C11  | .1 µf   |
| Q4  | 2N5109 NPN bipolar |  |  |
|     | transistor | C12  | .1 µf   |
| R8  | 43 KΩ      | C13  | .01 ]f  |
| R9  | 330Ω       | C14  | .1 µf   |
| R10 | 330Ω       | C15  | .01 µf  |
| R11 | 100Ω       | C16  | .1 µf   |
| R12 | 12Ω        | C17  | .01 µf  |
| R13 | 4.3 KΩ     | C18  | .1 µf   |
| R14 | 12Ω        | C19  | .01 µf  |
| R15 | 2.2 KΩ     | C20  | .1 µf   |
| R17 | 68.1Ω      | C21  | .1 µf   |
| R18 | 162Ω       | C23  | 33 pf   |
| R19 | 68.1Ω      | C24  | 33 pf   |
| R20 | 68.1Ω      | L2   | RFC     |
| R21 | 162Ω       | L6   | RFC     |
| R22 | 68.1Ω      | L7   | RFC     |
| C6  | .1 µf      | L8   | Bead    |
| C7  | .5 pf      | L9   | Bead    |
| L10 | Bead       | L12  | RFC     |
| L11 | RFC        | L13  | RFC     |

Apparatus of FIG. 2:

| Q101 | 2N5109 NPN bipolar |  |  |
| --- | --- | --- | --- |
|      | transistor          | C113 | .01 µf |
|      |                     | C114 | .1 µf  |
| Q102 | 2N5109 NPN bipolar  |      |        |
|      | transistor          | C115 | .01 µf |
| Q103 | SD203 N-channel     |      |        |
|      | enhancement FET     | C116 | .1 µf  |
| Q104 | CP643 N-channel FET | C117 | .1 µf  |
| R101 | 330Ω                | C118 | .01 µf |
| R102 | 330Ω                | C119 | .01 µf |
| R103 | 12Ω                 | C120 | .1 µf  |
| R106 | 270 KΩ              | C121 | .01 µf |
| R107 | 220Ω                | C122 | .1 µf  |
| R108 | 12Ω                 | C123 | .1 µf  |
| R109 | 10 KΩ               | C128 | .1 µf  |
| R110 | 2.2 KΩ              | C133 | 33 pf  |
| R115 | 10 KΩ               | C134 | 33 pf  |
| R116 | 4.3 KΩ              | L104 | RFC    |
| C102 | 5.6 pf              | L105 | RFC    |
| C106 | .1 µf               | L108 | RFC    |
| C107 | .1 µf               | L109 | RFC    |
| C110 | .1 µf               | L110 | RFC    |
| C111 | .1 µf               | L111 | RFC    |
| C112 | .1 µf               | L115 | Bead   |
|      |                     | L116 | Bead   |
|      |                     | L117 | Bead   |
|      |                     | L118 | 15 µhy |

RFC = 5 turns #26 wire on ferroxcube toroid 266CT1253E2A
Bead = 1 turn through Fair-Rite bead #2543000101

The apparatus of FIG. 1 operated satisfactorily over an RF signal frequency range of from 0.5 to 50 MHz and at a power level from 0.01 to up to 2,000 watts. The apparatus of FIG. 2 operated satisfactorily over an RF signal frequency range of from 0.5 to 50 MHz also and at a power level of the order of 1/10th picowatt to 100 milliwatts.

The apparatus as disclosed provides instantaneous measurement data on voltage, current, and phase. The information provided by the I and E signals permits establishing the phase relationship and therefore the power in the RF signal being transmitted. In addition, the information concerning these three parameters provide the exact measurement for determining the impedance terminating the transmission line. It is into the real part of this impedance that the power in the transmission line is flowing. The high input impedance of the voltage measuring sections and the low input impedance of the current measuring sections together with the isolation and impedance transformation provided by the isolation amplifier stages prevent significant perturbations from being introduced into the RF signal or into the measurement signals being produced.

Thus, while there has been shown and described what are considered preferred embodiments of the present invention, it will be obvious to those skilled in the art that various changes and modifications may be made therein without departing from the invention as defined by the appended claims.

What is claimed is:

1. Voltage, current, and phase monitoring apparatus comprising:
   transmission line means for conducting an RF signal therealong;
   current signal amplifier means for producing a current output signal representing the instantaneous current flow of the RF signal in said transmission line means at a current signal output terminal, said current signal amplifier means including
   a current signal isolation amplifier stage,
   current signal input coupling means coupled to the transmission line means and to the input of the current signal isolation amplifier stage for providing a low input impedance path to the current signal isolation amplifier stage,
   said current signal isolation amplifier stage being operable to provide impedance transformation between the signal present at its input and the signal produced at its output, and
   current signal delay means coupling the signal at the output of the current signal isolation amplifier stage to the current signal output terminal for causing a first predetermined time delay between the signal at the output of the current signal isolation amplifier stage and the current output signal at the current signal output terminal; and
   voltage signal amplifier means for producing a voltage output signal representing the instantaneous voltage of the RF signal in said transmission line means at a voltage signal output terminal, said voltage signal amplifier means including
   a voltage signal isolation amplifier stage,
   voltage signal input coupling means coupled to the transmission line means and to the input of the voltage signal isolation amplifier stage for providing a high input impedance path to the voltage signal isolation amplifier stage,
   said voltage signal isolation amplifier stage being operable to provide impedance transformation between the signal present at its input and the signal produced at its output, and
   voltage signal delay means coupling the signal at the output of the voltage signal isolation amplifier stage to the voltage signal output terminal for causing a second predetermined time delay between the signal at the output of the voltage signal isolation amplifier stage and the voltage output signal at the voltage signal output terminal;
   said first predetermined time delay of the current signal delay means plus propagation delays in the current signal input coupling means and in the current signal isolation amplifier stage being equal to said second predetermined time delay of the voltage signal delay means plus propagation delays in the voltage signal input coupling means and in the voltage signal isolation amplifier stage whereby the current output signal at the current signal output terminal representing the instantaneous current flow of the RF signal in said transmission line means is in proper phase relationship with the voltage output signal at the voltage signal output terminal representing the instantaneous voltage of the RF signal in said transmission line means.

2. Voltage, current, and phase monitoring apparatus in accordance with claim 1 wherein
said current signal input coupling means includes means inductively coupled to said transmission line means; and
said voltage signal input coupling means includes a direct connection to said transmission line means.

3. Voltage, current, and phase monitoring apparatus in accordance with claim 1 wherein
said current signal input coupling means includes input transformer means coupled to said transmission line means; and
said voltage signal input coupling means includes capacitive bridge means connected directly to said transmission line means and to said voltage signal isolation amplifier stage.

4. Voltage, current, and phase monitoring apparatus in accordance with claim 3 wherein
said current signal amplifier means includes a current output transformer for coupling the output of the current signal isolation amplifier stage to the current signal delay means; and
said voltage signal amplifier means includes a voltage output transformer for coupling the output of the voltage signal isolation amplifier stage to the voltage signal delay means.

5. Voltage, current, and phase monitoring apparatus in accordance with claim 4 wherein
said current signal isolation amplifier stage includes two bipolar transistors connected in a push-pull arrangement with the emitters coupled to the current signal input coupling means and the collectors coupled to the current output transformer; and
said voltage signal isolation amplifier stage includes two field effect transistors connected in series in a cascode arrangement with the gate of one transistor coupled to the voltage signal input coupling means and the drain of the other transistor coupled to the voltage output transformer.

* * * * *